United States Patent [19]
Noguchi et al.

[11] Patent Number: 5,236,516
[45] Date of Patent: Aug. 17, 1993

[54] PHOTOVOLTAIC APPARATUS

[75] Inventors: Shigeru Noguchi, Hirakata; Hiroshi Iwata, Neyagawa; Keiichi Sano, Takatsuki, all of Japan

[73] Assignee: Sanyo Electric Co., Ltd., Moriguchi, Japan

[21] Appl. No.: 762,850

[22] Filed: Sep. 18, 1991

[30] Foreign Application Priority Data

Sep. 20, 1990 [JP] Japan ............... 2-99643[U]

[51] Int. Cl.⁵ ......................................... H01L 31/052
[52] U.S. Cl. ..................................... 136/246; 136/244; 136/256; 136/258; 136/259; 136/251
[58] Field of Search ....... 136/244, 246, 256, 258 AM, 136/259, 251

[56] References Cited
U.S. PATENT DOCUMENTS 4,543,441  9/1985  Kumada et al. ............... 136/249
4,663,495  5/1987  Berman et al. ............... 136/248
4,879,251  11/1989  Kruehler et al. ............... 437/4
4,880,664  11/1989  O'Dowd et al. ............... 427/109

FOREIGN PATENT DOCUMENTS 59-124175  7/1984  Japan ............... 136/244

*Primary Examiner*—Aaron Weisstuch
*Attorney, Agent, or Firm*—Thomas R. Morrison

[57] ABSTRACT

A photovoltaic apparatus for directly converting light energy into electric energy, comprising a light shielding substrate, at least one surface of the light shielding substrate being a metal; a light transmitting insulating layer on the above surface; and a photovoltaic body on a surface of the insulating layer, the photovoltaic body including a light transmitting first electrode, an amorphous or microcrystal semiconductive layer, and a light transmitting second electrode laminated in this order, with the first electrode being in contact with the insulating layer.

14 Claims, 6 Drawing Sheets

PHOTOVOLTAIC APPARATUS

BACKGROUND OF THE INVENTION

1. Field of the Invention

The present invention relates to a photovoltaic apparatus for directly converting light energy such as solar energy into electric energy.

2. Description of the Prior Art

In recent years, there has been extensive research on photovoltaic apparatus because light energy is unlimited and clean. A photovoltaic apparatus of amorphous silicon type has the advantage of requiring low manufacturing energy and being easy to manufacture.

Photovoltaic apparatus of amorphous silicon is classified into one employing a light shielding substrate and one employing a light transmitting substrate.

FIG. 1 shows an example of the former. This apparatus employs a light shielding substrate 100 on which an insulating layer 101, metal electrodes 102, amorphous or microcrystal semiconductive layers 103 and transparent electrodes 104 are formed in this order.

FIG. 2 shows an example of the latter proposed in Japanese Patent Publication No. 60-41878. This apparatus employs a light transmitting substrate 110 on a rear surface of which transparent electrodes 111, amorphous or microcrystal semiconductive layers 112 and electrodes 113 are formed in this order. Each electrode 113 comprises a plurality of metal layers or ITO-silver layers.

In the apparatus of FIG. 1, since the amorphous or microcrystal semiconductive layers 103 are in contact with the metal electrodes 102, compounds may be generated on the interfaces therebetween. This causes the reflectance of the metal electrodes 102 to be lowered to about 80% or less. In addition, since the light is not reflected between the metal electrodes 102, the amount of light reflected on the metal electrodes 102 and incident into the amorphous or microcrystal semiconductive layers 103 is reduced. As is apparent from the above, this type of apparatus has the problem that photoelectric conversion efficiency is lowered.

On the other hand, in the apparatus of FIG. 2, since the connecting portions 114 for connecting the transparent electrodes 111 are formed of the same material as the metal electrodes 113, the upper ends 114a of the connecting portions 114 reflect the light. That is, the amount of light incident the metal electrodes 113 is reduced due to the connecting portions 114. In addition, as in the apparatus of FIG. 1, the light is not reflected at portions 115 between the metal electrodes 113, whereby the amount of light reflected at the metal electrodes 113 and incident the layers 112 is reduced. Thus, this type of apparatus also has the same problem as the apparatus of FIG. 1.

OBJECTS AND SUMMARY OF THE INVENTION

An object of the present invention, therefore, is to provide a photovoltaic apparatus capable of increasing the amount of light incident an amorphous or microcrystal semiconductive layer, thereby drastically improving photoelectric conversion efficiency.

The above object is fulfilled by a photovoltaic apparatus for directly converting light energy into electric energy, comprising a light shielding substrate, at least one surface of the light shielding substrate being formed of a metal; a light transmitting insulating layer formed on the above said surface of the light shielding substrate; and a photovoltaic body formed on a surface of the light transmitting insulating layer, the photovoltaic body including a light transmitting first electrode, an amorphous or microcrystal semiconductive layer and a light transmitting second electrode laminated in this order with the first electrode being in contact with the insulating layer.

According to the above construction, the photovoltaic body is formed of a light transmitting material and the surface of the light shielding substrate, which is provided under the photovoltaic body with the insulating layer therebetween, is formed of a metal. Therefore, light is reflected at the surface of the substrate which is out of contact with the amorphous or microcrystal semiconductive layer, whereby generation of a compound at the interface between the amorphous or microcrystal semiconductive layer and the first electrode is prevented. As a result, reflectance of the apparatus is improved. In addition, since the incident light is reflected at the whole surface of the substrate, the reflectance is further improved. This leads to an increase in the amount of light absorbed by the amorphous or microcrystal semiconductive layer, resulting in drastic enhancement of the conversion efficiency of the apparatus.

A plurality of photovoltaic bodies may be disposed on the light transmitting insulating layer and each adjacent pair of photovoltaic bodies may be electrically connected with each other.

The adjacent pair of photovoltaic bodies may be connected to each other by a light transmitting connecting electrode.

In this case, the conversion efficiency is further improved since the incident light is not reflected at the upper end of the connecting electrode.

The above object is also fulfilled by a photovoltaic apparatus for directly converting light energy into electric energy, comprising a light transmitting substrate; a light transmitting photovoltaic body formed on a rear surface of the light transmitting substrate, the photovoltaic body including a light transmitting first electrode, an amorphous or microcrystal semiconductive layer and a light transmitting second electrode laminated in this order, with the first electrode being in contact with the light transmitting substrate; a light transmitting insulating protect layer formed on a rear surface of the photovoltaic body; and a reflecting layer formed on a rear surface of the insulating protect layer, at least a surface of the reflecting layer which is in contact with the insulating protect layer being formed of a metal.

Since the second electrode is formed of a light transmitting material, the incident light is not reflected at the upper end of the second electrode but is reflected at the whole surface of the reflecting layer. Therefore, the amounts of both incident light and reflected light are increased, resulting in a drastic increase in the amount of light absorbed by the amorphous or microcrystal semiconductive layer. Thus, the conversion efficiency of the apparatus is drastically enhanced.

BRIEF DESCRIPTION OF THE DRAWINGS

These and other objects, advantages and features of the invention will become apparent from the following description thereof taken in conjunction with the accompanying drawings which illustrate specific embodiments of the invention. In the drawings.

DESCRIPTION OF THE PREFERRED EMBODIMENTS

First Embodiment

A first embodiment of the present invention will be explained, referring to FIGS. 3-6.

Figure 3:
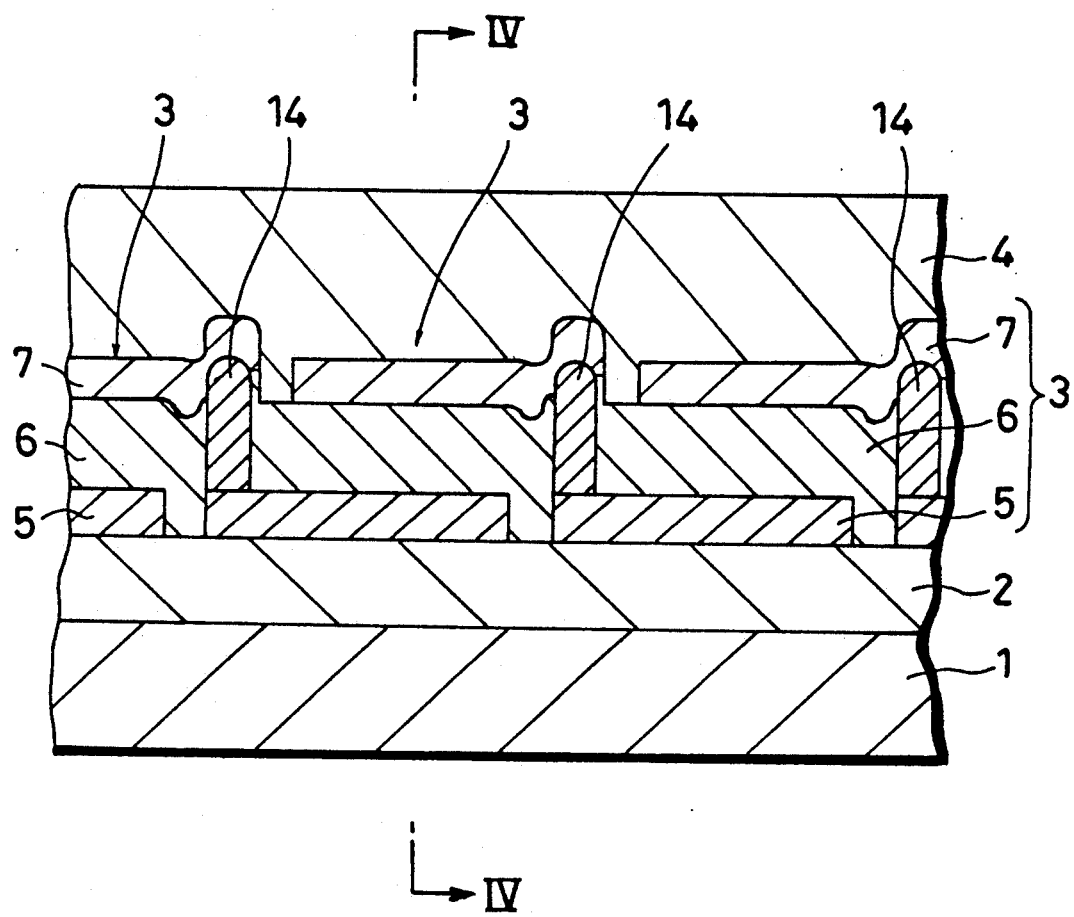
FIG. 3 is a sectional view showing a photovoltaic apparatus according to a first embodiment of the present invention.

As shown in FIG. 3, a photovoltaic apparatus in this embodiment employs a light shielding substrate 1 formed of stainless steel. A light transmitting insulating layer 2, photovoltaic elements 3 and a light transmitting protection layer 4 are formed on substrate 1. The insulating layer 2 is formed of silicon oxide and the protection layer 4 is formed of $SiO_2$.

The insulating layer 2 serves to electrically insulate the substrate 1 from the elements 3. Each photovoltaic element 3 comprises a first transparent electrode 5 formed of $SnO_2$, an amorphous or microcrystal semiconductive layer 6 and a second transparent electrode 7 formed of ITO.

Figure 4:
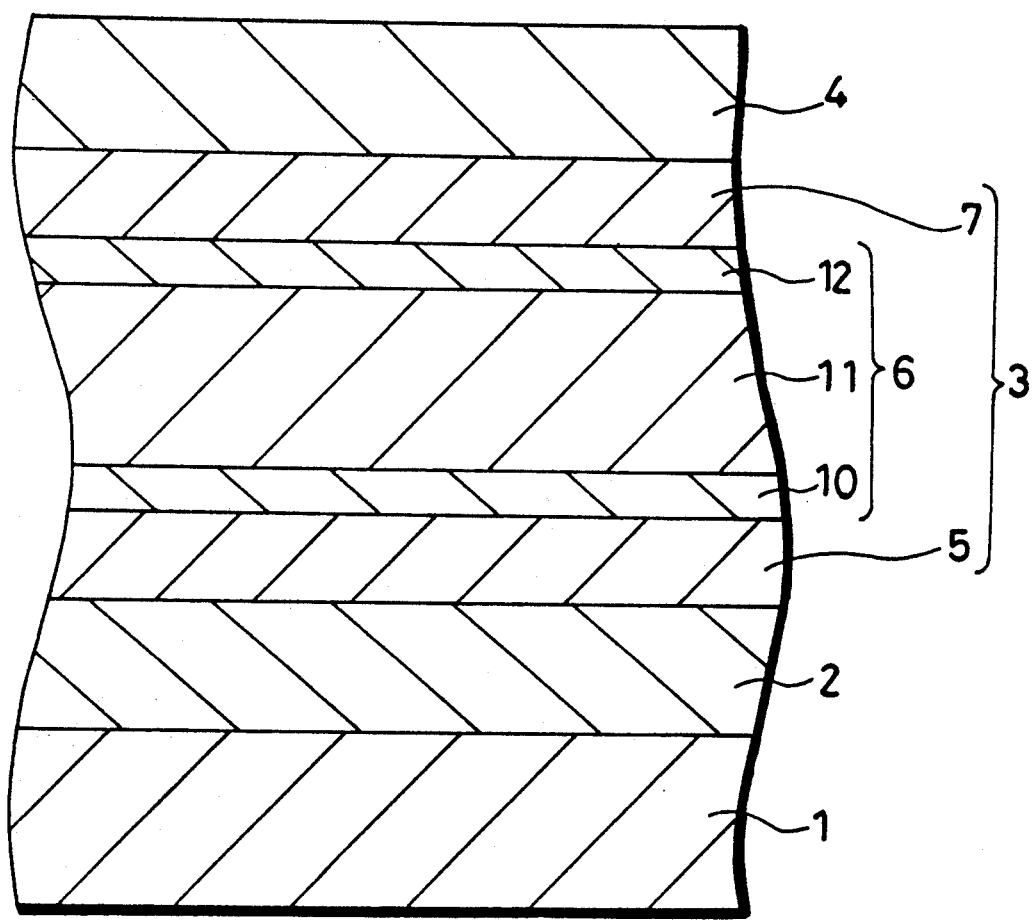
FIG. 4 is a sectional view taken along the line IV—IV of FIG. 3.

The amorphous or microcrystal semiconductive layer 6, as shown in FIG. 4, comprises a p-type first doped layer 10 formed of $a\text{-}Si_{1-x}C_x\text{:}H$ (amorphous silicon carbide), an i-type light absorbing layer 11 formed of a-Si:H and an n-type second doped layer 12 formed of $a\text{-}Si_{1-x}C_x\text{:}H$.

Each first transparent electrode 5 of the photovoltaic element 3 is electrically connected with the second transparent electrode 7 of the adjacent photovoltaic element 3 through a connecting portion 14, whereby each adjacent pair of photovoltaic elements 3 are connected to each other. Each doped layer 10 and 12 may have a thickness of 50–200Å, preferably 100Å.

The photovoltaic apparatus having the above construction is manufactured as follows.

First, the light transmitting insulating layer 2 and a light transmitting conductive film are formed on the light shielding substrate 1 by the sputtering method or the like. Then, the transparent conductive film is etched at predetermined intervals to form the first transparent electrodes 5. The etching process may be done by either the wet etching method or the laser method. Next, an end portion of each first transparent electrode 5 is coated with a silver paste and sintered. Thus, the connecting portions 14 are formed. The first doped layers 10, the light absorbing layers 11 and the second doped layers 12 are formed on remaining portions of the first transparent electrodes 5 in this order by the plasma method. Thereafter, a light transmitting conductive film is formed on the second doped layers 12 and is etched at predetermined intervals to form the second transparent electrodes 7. Thus, each adjacent pair of elements 3 are electrically connected to each other. The light transmitting protection layer 4 is formed on the second transparent electrodes 7 to complete the photovoltaic apparatus.

The photovoltaic apparatus manufactured as above will hereinafter be referred to as Apparatus A.

[Comparative Example]

Figure 1:
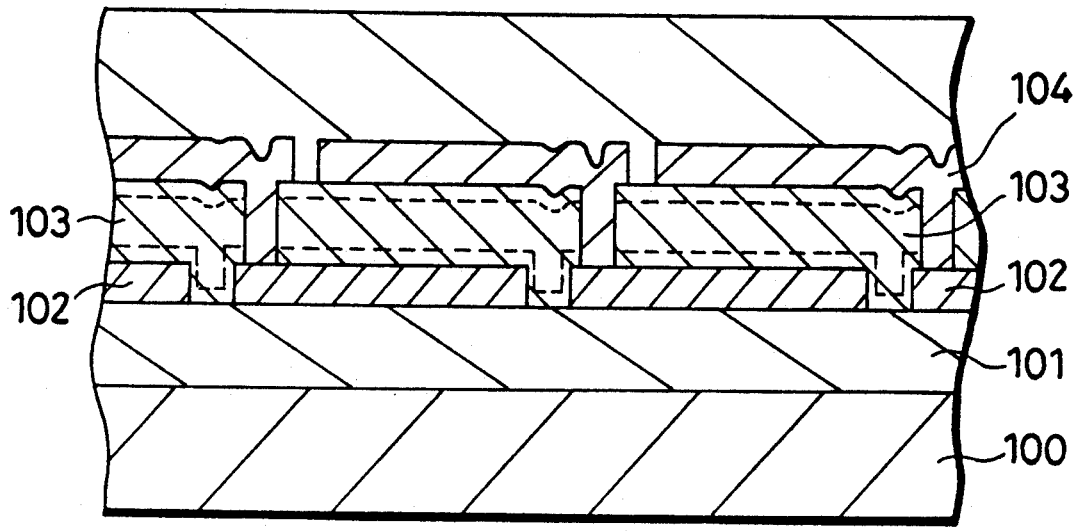
FIG. 1 is a sectional view of a conventional photovoltaic apparatus employing a light shielding substrate.
Figure 2:
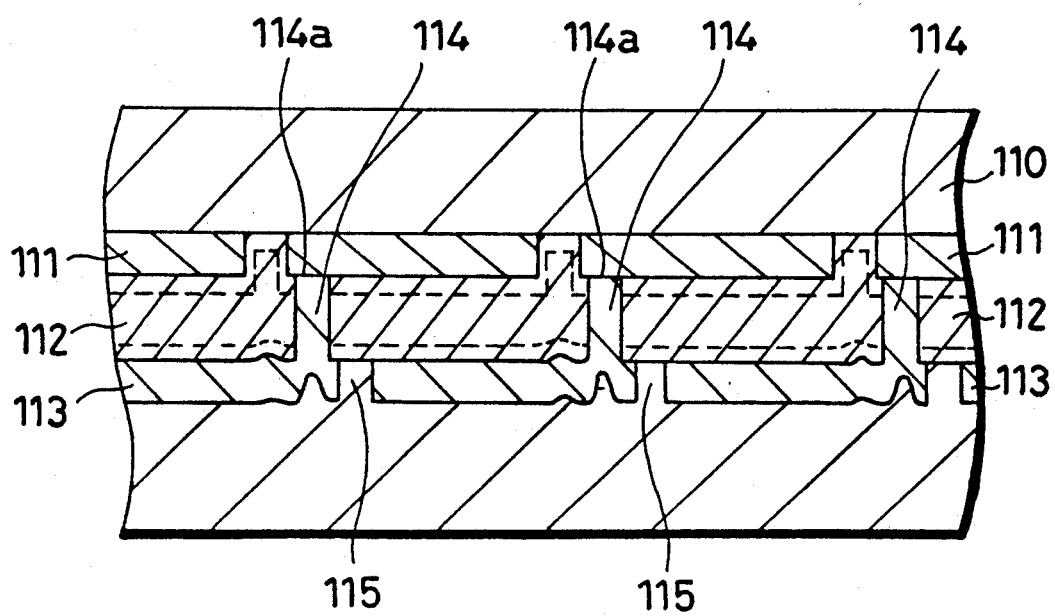
FIG. 2 is a sectional view of a conventional photovoltaic apparatus employing a light transmitting substrate.

A photovoltaic apparatus was obtained in the same way as Apparatus A except that a light transmitting insulating layer is not formed and metal electrodes are formed as shown in FIG. 1. This apparatus will hereinafter be referred to as Apparatus X.

Figure 5:
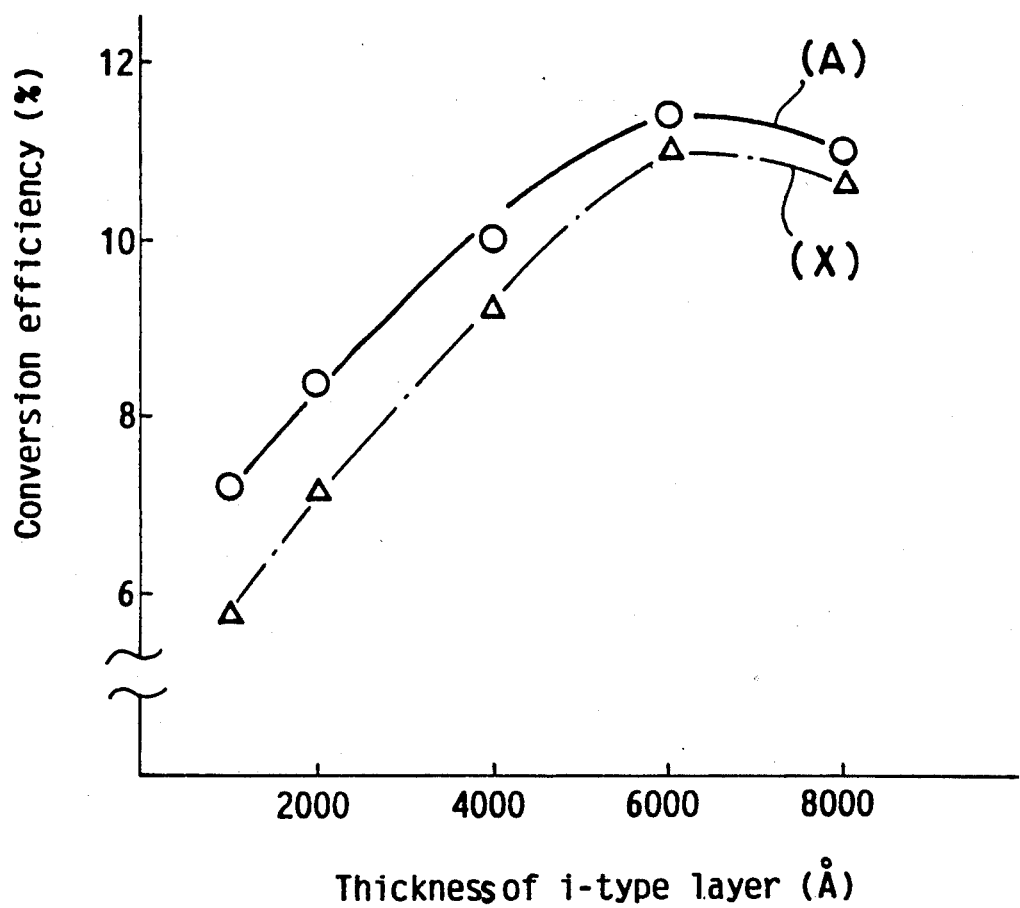
FIG. 5 is a graph showing the difference between photoelectric conversion efficiencies of Apparatus A according to the present invention and Comparative Apparatus X, with the thickness of i-type layers being changed.

Conversion efficiencies of the Apparatuses A and X were examined, with the thickness of the i-type light absorbing layers being changed. FIG. 5 shows the results. The experiment was conducted under the condition of AM-1, 100 mW/$cm^2$.

As is apparent from FIG. 5, conversion efficiency of Apparatus A according to the present invention is increased about 4–20% over that of Apparatus X irrespective of the thickness of the light absorbing type layer.

[Modification]

Figure 6:
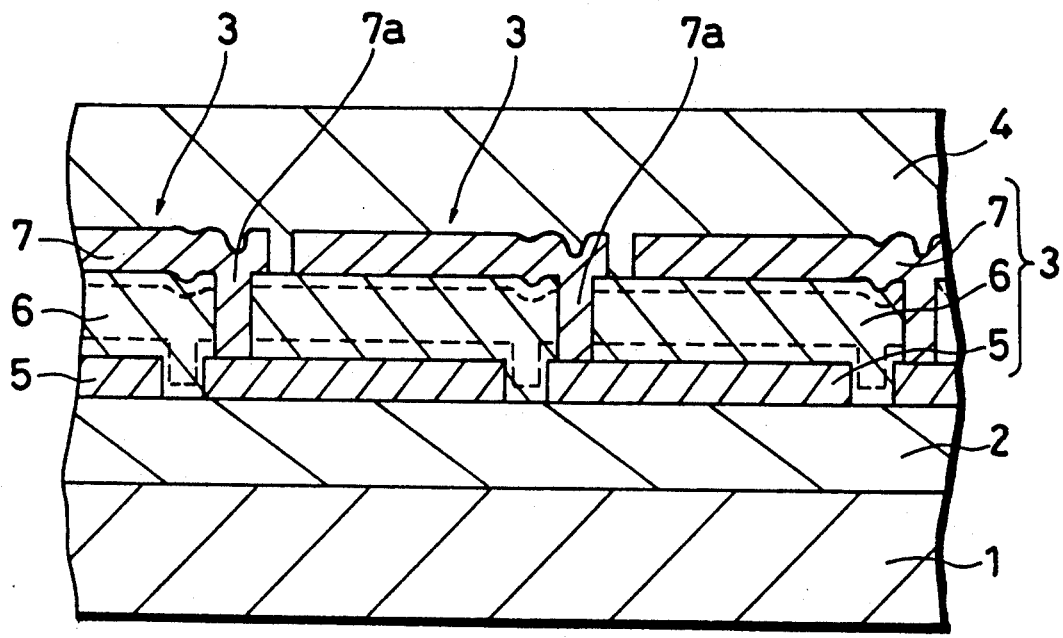
FIG. 6 is a sectional view showing a modification of the photovoltaic apparatus of FIG. 3.

The adjacent pair of elements 3 may also be connected to each other as follows. FIG. 6 shows such a modification. In FIG. 6, the amorphous or microcrystal semiconductive layers 6 are etched at portions which are to be connecting portions and then, the second transparent electrodes 7 are formed on the layers 6. As a result, the above portions are filled with the same material as the transparent electrodes 7 to form connecting portions 7a.

According to this construction, since the connecting portions 7a are transparent, the light is not prevented from reflecting at the upper ends of the connecting portions 7a. Therefore, the conversion efficiency can be further improved.

If the first transparent electrode 5 is "cloudy", the light incident the light shielding substrate 1 is scattered. ("Cloudy" means the electrode has a rugged surface, which looks milk-white to the naked human eye due to the scattering of the light.) Therefore, the amount of light absorbed in the amorphous or microcrystal semiconductive layer 6 can be further increased.

Second Embodiment

A second embodiment of the present invention will now be described, referring to FIGS. 7-9.

Figure 7:
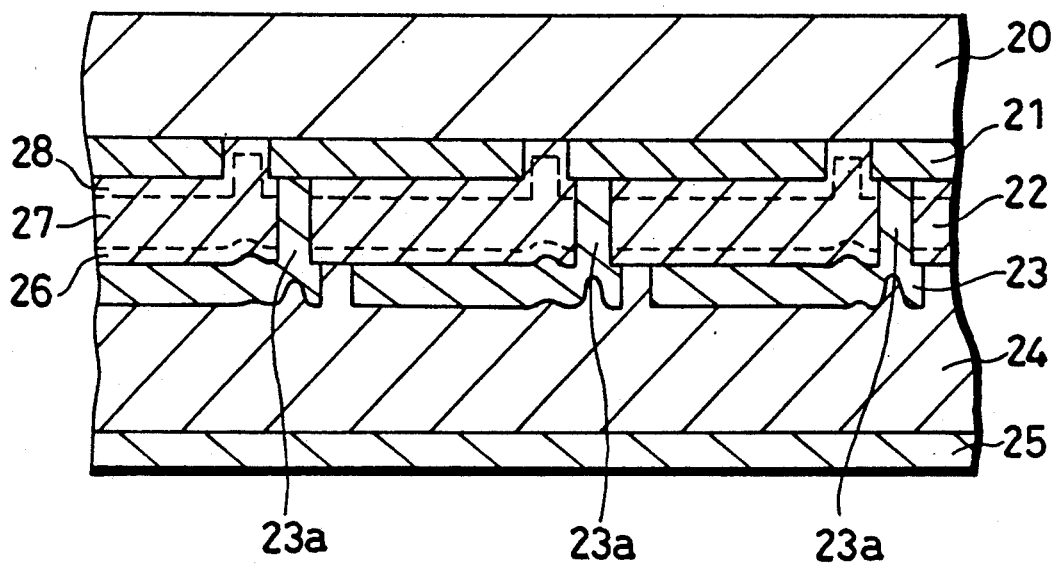
FIG. 7 is a sectional view showing a photovoltaic apparatus according to a second embodiment of the present invention.

As shown in FIG. 7, a photovoltaic apparatus in this embodiment employs a light transmitting substrate 20 made of glass. On the rear surface of the substrate 20, are formed first transparent electrodes 21, amorphous or micro crystal semiconductive layers 22 including first doped layers 28, light absorbing layers 27 and second doped layers 26, and second transparent electrodes 23. The transparent electrodes 21 and 23 and amorphous or microcrystal semiconductive layers 22 have the same construction as those of First Embodiment. On the rear surface of the second transparent electrode 23, are a light transmitting protection layer 24 formed of SiO$_2$ and a film 25. At least a surface of the film 25 which is in contact with the protection layer 24 is formed of a metal such as silver or copper, whereby the film 25 acts as a reflecting layer.

This photovoltaic apparatus is manufactured substantially in the same way as the modification in First Embodiment.

Figure 8:
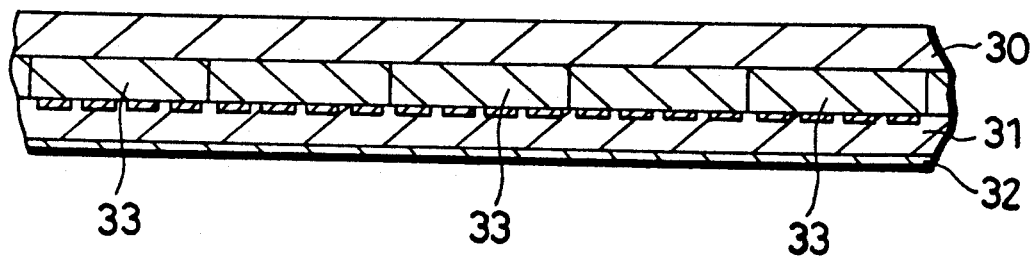
FIG. 8 is a sectional view showing a case wherein multiple photovoltaic apparatuses of FIG. 7 are provided.
Figure 9:
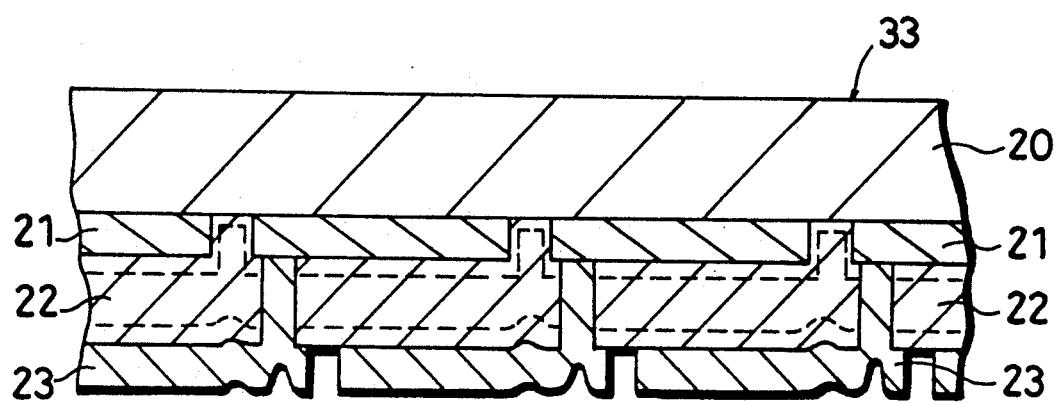
FIG. 9 is a view showing in more detail a portion of the apparatus of FIG. 8.

FIG. 8 shows a plurality of photovoltaic apparatuses 33 each having the above construction. The apparatuses 33 having the second transparent electrode 23 formed as shown in FIG. 9 are disposed on a rear surface of a cover glass 30. Then, the apparatuses 33 are covered with a resin layer 31 formed of EVA etc. and the resin layer 31 is covered with a film 32. At least the surface of the film 32 which is in contact with the resin layer 31 is formed of a metal.

When the first or second transparent electrode 23 is formed to be cloudy, the light incident into the film 25 is scattered, whereby the amount of light absorbed in the amorphous or microcrystal semiconductive layer 22 can be further increased.

Other Points

The light shielding substrate 1 may be formed of metals other than stainless steel if the metals have high reflectances. Further, the substrate 1 may be obtained by coating a plate formed of glass, plastic or polyimide with a metal having a high reflectance such as stainless steel, silver, copper or the like.

The light transmitting substrate 20 may be formed of plastic, polyimide or the like instead of glass.

The light transmitting insulating layer 2 may be of silicon nitride, polyimide or the like instead of silicon oxide.

The light transmitting protect layer 24 may be formed of Si$_3$N$_4$ and resins such as EVA instead of SiO$_2$, or of a combination of the above materials.

The first transparent electrode 5 or 21 is not limited to SnO$_2$ in the above embodiment but may be formed of indium tin oxide (In$_2$O$_3$/SnO$_2$, ITO) or zinc oxide (ZnO).

In each of the above embodiments, the photovoltaic apparatus has a pin-type construction in which the p-type layer is closest to the substrate 1 or 20. The apparatus may have an nip-type construction in which the n-type layer is closest to the substrate 1 or 20.

The second doped layer 12 or the first doped layer 28 is not limited to that in the above embodiment but may be formed of a-Si$_{1-x}$N$_x$:H (amorphous silicon nitride) or μc-SiH (microcrystal silicon).

The first doped layer 10 or the second doped layer 26 is not limited to that in the above embodiment but may be formed of a-Si$_{1-x}$N$_x$:H, μc-SiH or a-Si:H (amorphous silicon).

The i-type light absorbing layer 11 or 27 is not limited to that in the above embodiment but may be formed of a-SiGe:H or the like.

The light transmitting protection layer 4 is not limited to that in the above embodiment it may be Si$_3$N$_4$, a resin such as EVA, or a combination of the above materials.

Although the present invention has been fully described by way of embodiments with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A photovoltaic apparatus for directly converting light energy into electric energy, comprising:
    a reflective light shielding substrate, at least one surface of said reflective light shielding substrate being formed of a metal;
    a light transmitting insulating layer on said at least one surface of said reflective light shielding substrate;
    a photovoltaic body on a surface of said light transmitting insulating layer; and
    said photovoltaic body including a light transmitting cloudy first electrode, a semiconductor including an amorphous semiconductor layer, and a light transmitting second electrode laminated in this order with the first electrode being in contact with said insulating layer.

2. A photovoltaic apparatus as claimed in claim 1, wherein said semiconductor including said amorphous semiconductor layer has a first doped layer, a light absorbing layer, and a second doped layer laminated in this order, with the first doped layer being in contact with the first electrode.

3. A photovoltaic apparatus as claimed in claim 2, wherein the first doped layer is p-type, the light absorbing layer is i-type, and the second doped layer is n-type.

4. A photovoltaic apparatus as claimed in claim 2, wherein the first doped layer is n-type, the light absorbing layer is i-type, and the second doped layer is p-type.

5. A photovoltaic apparatus as claimed in claim 1, wherein said light transmitting insulating layer is selected from a group consisting of silicon oxide, silicon nitride, and polyimide.

6. A photovoltaic apparatus as claimed in claim 1, wherein said reflective light shielding substrate is formed of a metal having a high reflectance.

7. A photovoltaic apparatus as claimed in claim 1, wherein said reflective light shielding substrate includes a coating having a high reflectance plated on a surface of a plate, said plate being selected from a group consisting of glass, plastic, and polyimide.

8. A photovoltaic apparatus for directly converting light energy into electric energy, comprising:
    a light transmitting substrate;
    a light transmitting photovoltaic body on a rear surface of said light transmitting substrate, said photovoltaic body including a light transmitting first electrode, a semiconductive layer including an amorphous semiconductive layer, and a cloudy light transmitting second electrode laminated in this order, with the first electrode being in contact with said light transmitting substrate;
    a light transmitting insulating protection layer on a rear surface of said photovoltaic body; and
    a reflecting layer on a surface of said insulating protection layer, at least a surface of said reflecting layer which is in contact with said insulating protection layer being a metal.

9. A photovoltaic apparatus as claimed in claim 8, wherein a plurality of photovoltaic bodies are disposed on said light transmitting substrate and wherein each adjacent pair of photovoltaic bodies are electrically connected to each other.

10. A photovoltaic apparatus as claimed in claim 9, wherein the adjacent pair of photovoltaic bodies are connected to each other through a light transmitting connecting electrode.

11. A photovoltaic apparatus as claimed in claim 8, wherein said semiconductor, including said amorphous semiconductor layer, has a first doped layer, a light absorbing layer, and a second doped layer laminated in this order, with the first doped layer being in contact with the first electrode.

12. A photovoltaic apparatus as claimed in claim 11, wherein the first doped layer is p-type, the light absorbing layer is i-type and the second doped layer is n-type.

13. A photovoltaic apparatus as claimed in claim 11, wherein the first doped layer is n-type, the light absorbing layer is i-type and the second doped layer is p-type.

14. A photovoltaic apparatus as claimed in claim 8, wherein the reflecting layer is a metal film.

* * * * *